United States Patent [19]

Disser et al.

[11] Patent Number: 5,055,762

[45] Date of Patent: Oct. 8, 1991

[54] CURRENT CONTROLLED FULL WAVE TRANSITOR BRIDGE INVERTER FOR A MULTIPLE PHASE AC MACHINE

[75] Inventors: Robert J. Disser, Dayton; Richard N. Lehnhoff, Kettering, both of Ohio

[73] Assignee: General Motors Corporation, Detroit, Mich.

[21] Appl. No.: 338,821

[22] Filed: Apr. 17, 1989

[51] Int. Cl.[5] .............................................. H02P 5/40
[52] U.S. Cl. .................................................... 318/811
[58] Field of Search ....................... 363/41, 98, 53, 56, 363/17; 318/811; 323/367

[56] References Cited

U.S. PATENT DOCUMENTS

| | | | |
|---|---|---|---|
| 4,123,692 | 10/1978 | Gilmore et al. | 318/808 |
| 4,520,437 | 5/1985 | Boettcher, Jr. et al. | 363/98 |
| 4,567,553 | 1/1986 | Foch et al. | 363/98 |
| 4,748,532 | 5/1988 | Commander et al. | 363/98 |

Primary Examiner—David Smith, Jr.
Attorney, Agent, or Firm—Mark A. Navarre

[57] ABSTRACT

A multiple phase full wave motor drive transistor bridge inverter control circuit in which the base drive power supply for the transistors is transformer isolated from the on/off logic circuits, and the current control function for all of the inverter transistors is performed by a single current regulation circuit. A separate transformer is provided for each phase of the bridge inverter, and the transformer primaries are connected series to form the load of the current regulation circuit. The transformer secondaries supply base current to the upper and lower transistors of each respective phase, and the logic circuits schedule the conduction of the inverter transistors such that one transistor of each phase is always conductive, neglecting dead time. Each of the secondary circuits includes an impedance matching circuit to maintain balanced loading under conditions wherein the inverter transistors are reverse biased due to lagging power factor motor winding currents.

1 Claim, 3 Drawing Sheets

CURRENT CONTROLLED FULL WAVE TRANSITOR BRIDGE INVERTER FOR A MULTIPLE PHASE AC MACHINE

This invention relates to the control of a multiple phase full wave transistor bridge inverter driving an AC machine, and more particularly to a novel transistor base drive current control circuit therefor.

BACKGROUND OF THE INVENTION

In motor drive transistor inverters, close regulation of both the forward and reverse base current for each of the transistors is generally required in order to protect the transistors and limit switching losses. Typically, the current regulation is separately performed for each of the inverter transistors and is integrated with the on/off transistor drive logic. Although relatively straightforward, this approach lacks noise immunity in the logic function and tends to be costly, due to duplication of the current regulation function for the various transistors of the inverter.

SUMMARY OF THE PRESENT INVENTION

The present invention is directed to a multiple phase full wave motor drive transistor bridge inverter control circuit in which the base drive power supply for the transistors is transformer isolated from the on/off logic circuits and the current control function for all of the inverter transistors is performed by a single current regulation circuit.

A separate transformer is provided for each phase of the bridge inverter and the transformer primaries are connected series to form the load of the current regulation circuit. The transformer secondaries supply base current to the upper and lower transistors of each respective phase and the logic circuits schedule the conduction of the inverter transistors in complementary fashion such that one transistor of each phase is always conductive, neglecting dead time. As a result, the loading on each of the transformers is substantially equal, and the base current supplied by the secondaries can be regulated by regulating the current supplied to the serially connected primaries.

In addition, each of the secondary circuits includes an impedance matching circuit to maintain the balanced transformer loading under conditions wherein the bridge transistors are reverse biased by lagging power factor motor winding current.

BRIEF DESCRIPTION OF THE DRAWINGS

FIG. 3 depicts the current regulation circuit for the serially connected transformer primaries, and FIG. 4 depicts a representative power supply and logic circuit for one of the bridge transistors.

DETAILED DESCRIPTION OF THE DRAWINGS

Figure 1:
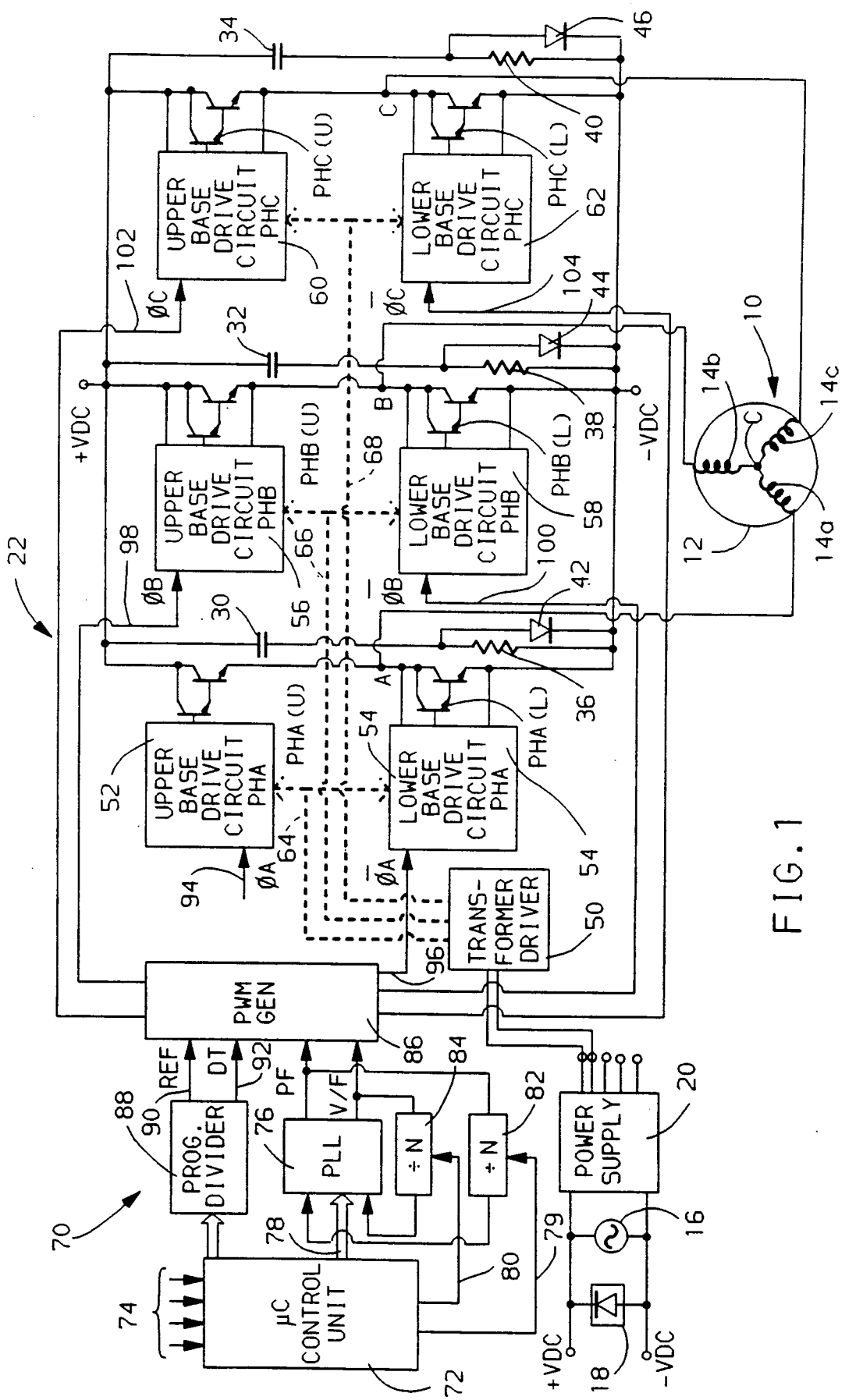
FIG. 1 is a block diagram of a computer-based controller for a three-phase induction motor, including a full wave transistor bridge inverter and the transistor base drive circuitry of this invention.

Referring to FIG. 1, the reference numeral 10 generally designates a three-phase AC induction motor comprising a rotor 12 and three stator windings 14a, 14b and 14c. The stator windings are mutually connected at one end to a common terminal C and selectively connectible at their other ends to a source of direct voltage VDC, which may be generated from an external AC source 16 and a bridge rectifier circuit 18, as schematically shown in FIG. 1. Various other system voltages are provided by the power supply 20. The selective connection of the stator windings 14a, 14b and 14c to the voltage source VDC is performed by the upper and lower power Darlington transistors PHA(U), PHA(L), PHB(U), PHB(L), PHC(U) and PHC(L) of a full wave bridge inverter 22. Each such transistor includes an internal parallel-connected freewheeling diode (not shown) for carrying negative winding current and circulating inductive current at turn-off of the respective transistor. The winding 14a is connected to plus and minus VDC via the upper and lower bridge transistors PHA(U), PHA(L); the winding 14b is connected to plus and minus VDC via the upper and lower bridge transistors PHB(U), PHB(L); and the winding 14c is connected to plus and minus VDC via the upper and lower bridge transistors PHC(U), PHC(L). Connected across each pair of upper and lower bridge transistors is a conventional RC snubber circuit comprising a capacitor 30, 32, 34, a resistor 36, 38, 40 and a diode 42, 44, 46.

The forward and reverse base drive current control for the power transistors of bridge inverter 22 is performed by the transformer driver circuit 50 and individual base drive circuits 52, 54, 56, 58, 60 and 62 associated with each transistor. The transformer driver circuit 50, described below in detail in reference to FIG. 3, regulates the base drive current and is magnetically coupled to the base drive circuits associated with each phase winding as indicated by the broken lines 64, 66 and 68. The base driver circuits 52, 54, 56, 58, 60 and 62 are all identical, the driver circuit 52 upper transistor PHA(U) being described below in detail in reference to FIG. 4.

The on/off control for the power transistors of bridge inverter 22 is performed by a computer-based PWM control circuit, generally designated by the reference numeral 70. The microcomputer uC 72 is responsive to various system inputs as indicated by the reference numeral 74, and generates digital output commands for a dual phase-locked-loop PLL circuit 76 on lines 78, 79 and 80 pertaining to the desired motor power frequency PF and voltage-to-frequency V/F ratio. In each case, the uC 72 carries out the signal conversion by supplying a reference frequency to PLL circuit 76 via line 78, and controlling the operation of the feedback Divide-By-N circuits 82 and 84 via lines 79 and 80. The PF and V/F outputs of PLL circuit 76 are applied as inputs to a PWM generator chip 86, such as the Signetics HEF4752V. The uC 72 supplies the PWM chip 86 a reference frequency REF and information pertaining to the desired dead time DT via a programmable divider 88 and lines 90 and 92. The PWM chip 86 operates in response to the above described inputs and develops modulated on/off drive signals on lines 94, 96, 98, 100, 102 and 104 for the base driver circuits 52, 54, 56, 58, 60 and 62, respectively. The drive signals for the upper and lower bridge transistors of each phase are complementary, and the specified dead time refers to an interswitching period during which both such transistors are signaled to a nonconductive or "off" state.

Figure 2:
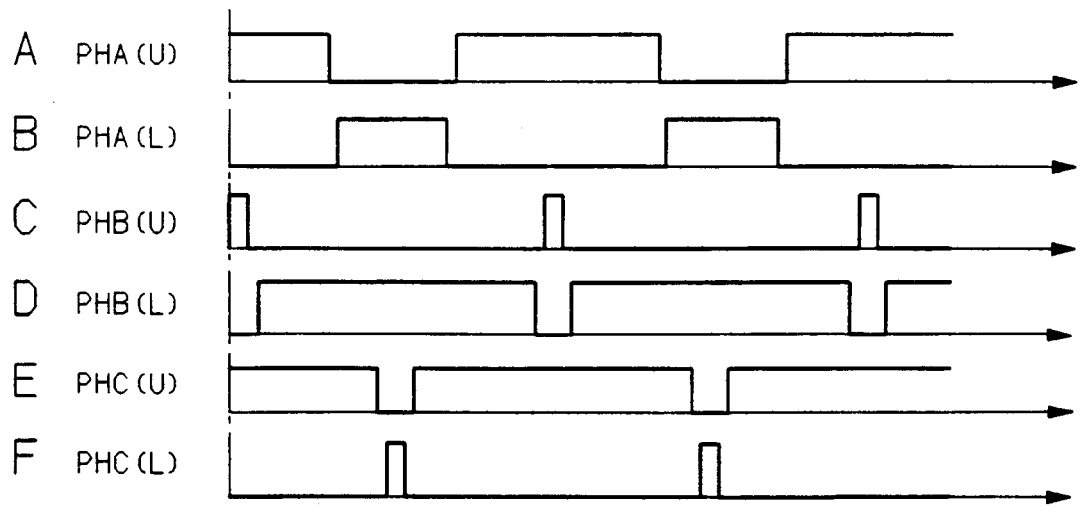
FIG. 2 is a graph illustrating the conduction schedule for the six power transistors of the bridge inverter of FIG. 1.

Graphs A-F of FIG. 2 depict on/off drive signals of the type generated on lines 94-104 by the PWM chip 86 of FIG. 1a, neglecting the dead time DT. Significantly, it is noted that either the upper or lower bridge transistor of each phase is always signaled to the conductive or "on" state. It would be apparent from an extended view of the drive signals that the modulation of the bridge conduction periods results in the application of a sinusoidal voltage and current to the windings 14a, 14b and 14c.

Figure 3:
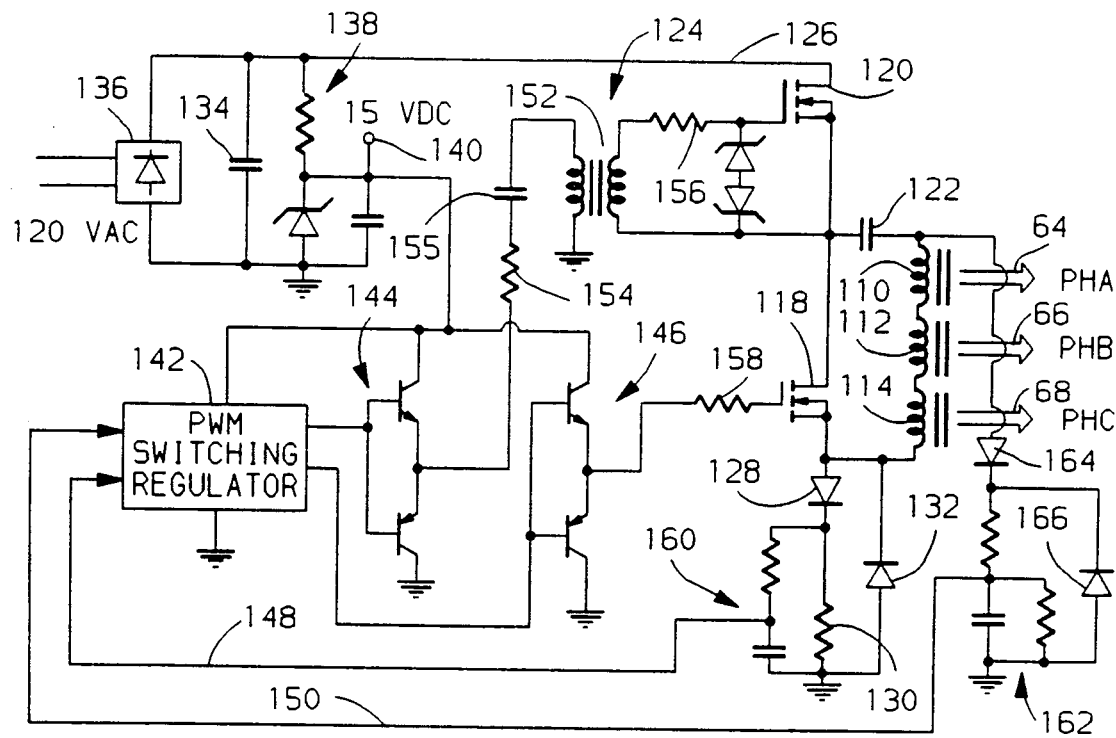
FIGS. 3 and 4 are circuit diagrams of the base drive circuits of this invention.

Referring now to FIG. 3, the transformer driver circuit 50 performs current regulated excitation of three serially connected transformer primary windings 110, 112 and 114. Each primary winding 110, 112, 114 is magnetically coupled to two pairs of secondary windings. As indicated by the broken lines 64-68, the primary winding 110 is magnetically coupled to secondary windings in the phase-A base driver circuits 52, 54; the primary winding 112 is magnetically coupled to secondary windings in the phase-B base driver circuits 56, 58; and the primary winding 114 is magnetically coupled to secondary windings in the phase-C base driver circuits 60, 62. The primary windings 110, 112, 114 are coupled via capacitor 122 to the power field-effect transistors (FET) 118 and 120.

The FETs 118 and 120 are alternately switched on and off at a frequency of approximately 100 kHz by a current regulator circuit designated generally by the reference numeral 124. When FET 120 is on and FET 118 is off, the primary windings 110, 112, 114 are charged with current from a 150 VDC source on line 126 via diode 128 and resistor 130. When FET 120 turns off to disconnect capacitor 122 from the voltage source, the FET 118 conducts to reverse the current through the primary windings 110, 112 and 114.

The 150 VDC supply on line 126 is developed across filter capacitor 134 at the output of bridge rectifier 136, which is supplied with a 120 VAC input from power supply 20. A Zener voltage regulator designated generally by the reference numeral 138 is connected to the line 126 and develops a 15 VDC control voltage at terminal 140.

The current regulator circuit 124 is built around a PWM switching regulator chip 142, such as the Motorola TL494. The regulator chip 142 is powered by the 15 VDC source and controls the conduction of the totem pole driver circuits 144 and 146 in response to various external timing circuits (not shown) and the feedback signals on lines 148 and 150. The driver circuit 144 is capacitively coupled to the pulse transformer 152 via resistor 154 and capacitor 155, and the secondary winding of the pulse transformer 152 is connected to the gate of power FET 120 via resistor 156. The driver circuit 146 is connected directly to the gate of power FET 118 via resistor 158.

The feedback signal on line 148 is obtained from the RC network 160 and provides a filtered indication of the current supplied to the primary windings 110, 112, 114 during the conductive periods of FET 120. The feedback signal on line 150 is obtained from the network 162, which rectifies the 100 kHz AC, and provides an indication of the average voltage supplied to the primary windings 110, 112, 114 during the conductive periods of FET 120. The regulator chip 142 compares the two feedback signals with internally generated references to develop an error signal, and correspondingly varies the PWM duty cycle of the switching transistors 144, 146 to maintain the current in the primary windings 110, 112, 114 at a specified value. Regulating the current in the serially connected transformer primary windings 110, 112, 114 also regulates the voltage and current of the various transformer secondary windings, provided that the transformers each exhibit substantially constant and equal impedance. In a mechanization of the illustrated embodiment, the regulator chip 142 was operated at a switching frequency of about 100 kHz, and the primary winding current was regulated to 0.4 A.

Figure 4:
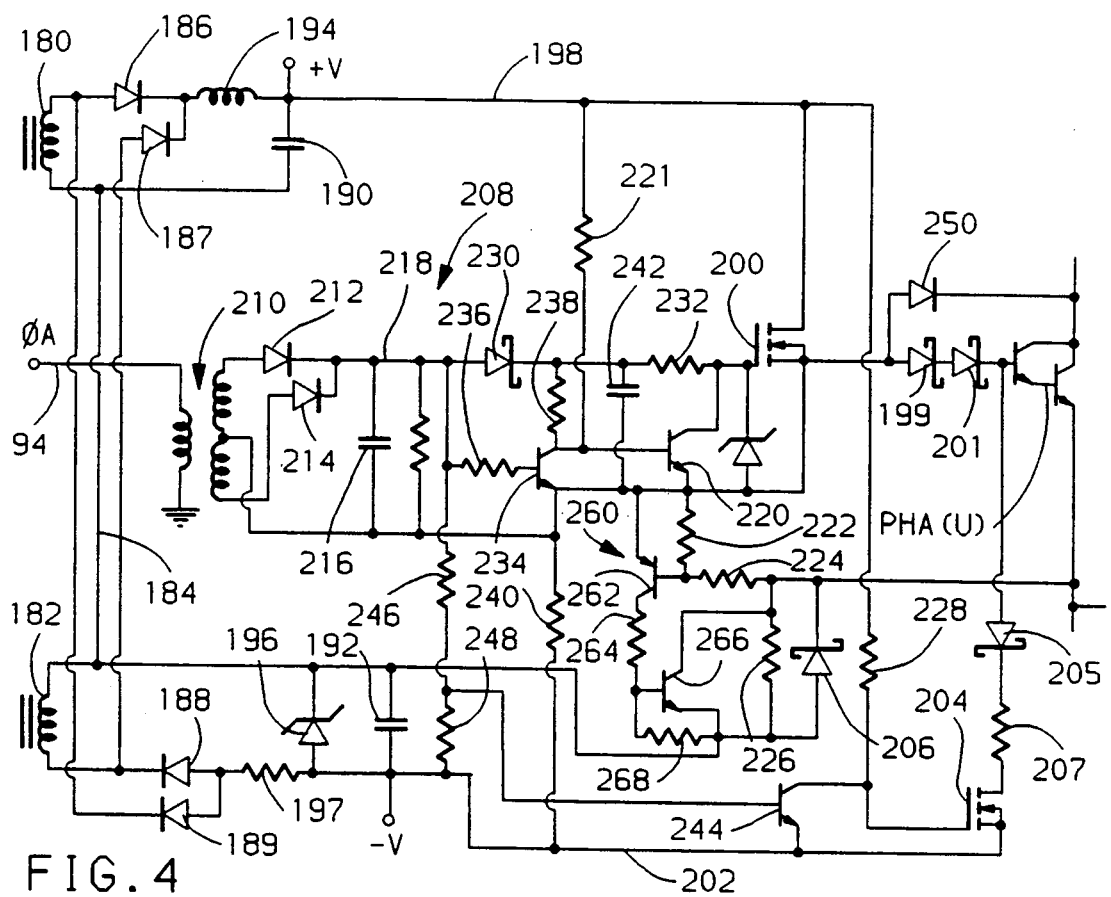

FIG. 4 depicts the base driver circuit 52 of FIG. 1; the reference numeral 94 and transistor designation PHA(U) have been repeated from FIG. 1. Each such base driver circuit 52, 54, 56, 58, 60, 62 includes a pair of secondary windings magnetically coupled to the primary winding 110, 112 or 114. As indicated in reference to FIG. 1, the secondary windings of the phase-A base driver circuits 52 and 54 are coupled to the primary winding 110; the secondary windings of the phase-B base driver circuits 56 and 58 are coupled to the primary winding 112; and the secondary windings of the phase-C base driver circuits 60 and 62 are coupled to the primary winding 114. In FIG. 4, the secondary windings have been assigned the reference numerals 180 and 182.

Referring specifically to base driver circuit 52, the secondary windings 180 and 182 are coupled in center-tap style by the line 184. Their output voltages are rectified by the diodes 186-189 and filtered by the energy storage capacitors 190 and 192 to define positive and negative DC supply voltages, designated $+V$ and $-V$. The inductor 194 acts as a current filter for the $+V$ supply; Zener diode 196 and resistor 197 regulate the $-V$ voltage. The $+V$ bus line 198 supplies forward bias current to the upper bridge transistor PHA(U) via power FET 200, the Schottky diodes 199 and 201 and resistor 226. The $-V$ bus line 202 sinks reverse bias current from the upper bridge transistor PHA(U) via power FET 204, the Schottky diodes 205 and 206 and the resistor 207.

The conduction of the FETs 200 and 204, and hence the conduction of the bridge transistor PHA(U), is controlled by a logic control circuit designated generally by the reference numeral 208. As indicated in reference to FIG. 1, the input to the logic control circuit 208 is the modulated phase-A control signal on line 94. The control signal is applied to the isolation transformer 210 and then demodulated by the diodes 212 and 214 and filtered by the capacitor 216 to define a waveform on line 218 like that depicted in Graph A of FIG. 2.

When the signal on line 218 is logically low, transistor 220 is biased conductive via the resistor 221 to pull the gate and source of FET 200 low through resistors 222, 224 and 226, biasing the drain-to-source circuit of FET 200 nonconductive. At the same time, FET 204 is biased conductive by the $+V$ supply bus 198 via resistor 228.

When the signal on line 218 is logically high, however, FET 200 is biased conductive via diode 230 and resistor 232, and transistor 234 is biased conductive via resistor 236 to turn off transistor 220. At the same time, the transistor 244 is biased conductive via the divider resistors 246 and 248 to turn off FET 204. The diode 250 connected between the drain of FET 200 cooperates with the Schottky diodes 199 and 201 to keep the bridge transistor PHA(U) out of deep saturation while it is being forward biased.

Significantly, the above drive arrangement prevents any overlap in the conduction periods of power FETs 200 and 204. At the initiation of forward bias current, the gate capacitance of FET 204 is discharged at a relatively fast rate through the collector-emitter circuit of transistor 244 for relatively quick turn-off of the FET 204, while the gate capacitance of FET 200 is charged at a relatively slow rate through the resistor 232 for relatively slow turn-on of the FET 200. At the initiation of reverse bias current, the gate capacitance of FET 200 is discharged at a relatively fast rate through the collector-emitter circuit of transistor 220 for relatively quick turn-off of the FET 200, while the gate capacitance of FET 204 is charged at a relatively slow rate through the resistor 228 for relatively slow turn-on of the FET 204.

Under certain operating conditions of the bridge, the lagging power factor of the motor 10 can cause a bridge transistor to be reverse biased even though it is signaled to a conductive state. This occurs when the winding voltage is positive and the lagging power factor causes the winding current to be negative. Although the respective bridge transistor is trying to apply voltage to the phase winding, the winding current is being carried by the transistor's internal freewheeling diode. In such case, the transistor is reverse biased and the voltage across its base-emitter junction $V_{be}$ is one diode drop (approximately one volt) negative—the voltage across the base-emitter junction $V_{be}$ of a forward biased transistor is two diode drops (approximately two volts) positive.

Referring to phase-A and driver circuit 52, the condition described above causes the load impedance on the transformer secondary windings 180 and 182 of transformer 110 to be significantly lower when the transistor PHA(U) is reverse biased than when it is forward biased. Normally, this would cause the current regulator of FIG. 3 to reduce the primary voltage in order to maintain the desired primary winding current. This, in turn, would lead to insufficient drive capability in the turn-on of transistor PHA(L) and consequent conduction losses therein.

The reverse bias impedance change described above is remedied, according to this invention, by the impedance matching circuit generally designated in FIG. 4 by the reference numeral 260. The resistor 226 is connected between the emitter of bridge transistor PHA(U) and the common line 184 of the $\pm V$ power supplies. Resistor 226 is shunted by transistor 266 with the associated base resistors 264 and 268. Transistor 266 is controlled by transistor 262 with the associated base resistors 222 and 224. Thus, the emitter of transistor 262 is connected to the base of bridge transistor PHA(U) through 199 and 201, and the base of transistor 262 is connected to the emitter of bridge transistor PHA(U) through resistor 224.

If bridge transistor PHA(U) is forward biased when signal line 218 is high (the normal situation), transistors 262 and 266 conduct due to the positive two diode voltage drop across the base-emitter junction of transistor PHA(U). In this condition, the voltage drop across the series combination of the base-emitter circuit of bridge transistor PHA(U) and the impedance matching network 260 is approximately two (2) volts.

If bridge transistor PHA(U) is reverse biased when signal line 218 is high (the power factor induced situation), transistor 262 is held off by the negative one diode voltage drop across the base-emitter junction of transistor PHA(U). Transistor 266 is also biased off, connecting the resistor 226 in series with the emitter of transistor PHA(U). In this condition, the voltage drop across the series combination of the base-emitter circuit of bridge transistor PHA(U) and the impedance matching network 260 is determined by the sum of the negative one (1) volt $V_{be}$ and the positive voltage across resistor 226. The resistor 226 is sized in relation to the base drive current so that the resistor voltage in such condition is approximately three (3) volts. In such case, the voltage drop across the series combination of the base-emitter circuit of bridge transistor PHA(U) and the impedance matching network 260 during reverse bias operation is two (2) volts, just as in the forward bias condition. In a mechanization of the illustrated embodiment, the base drive current was regulated to 1.5 A, dictating a resistor value (226) of 2 ohms.

The base driver circuit operation described above is graphically illustrated in FIGS. 5 and 6. The collector-emitter voltages $V_{ce}$ of various base driver transistors are depicted; the respective transistors are biased off when their $V_{ce}$ is logically high, and on when their $V_{ce}$ is logically low. The graphs are on a common time base with the graphs of FIG. 2.

Figure 5:
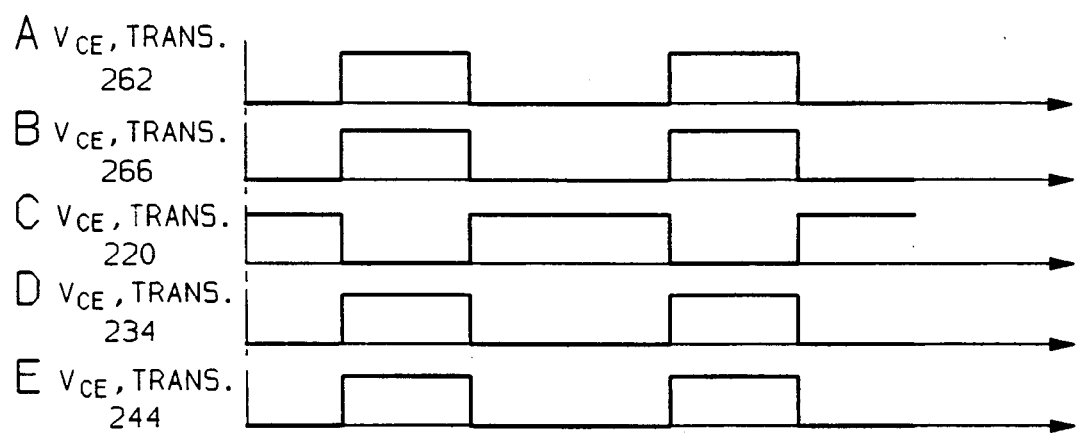
FIGS. 5 and 6 are graphs illustrating the operation of the power supply and logic circuit of FIG. 4 during forward and reverse biasing, respectively, of the associated bridge transistor.

FIG. 5 shows waveforms for the condition where bridge transistor PHA(U) conducts current in the forward bias mode. Graphs A and B indicate that transistors 262 and 266 conduct whenever the bridge transistor PHA(U) is gated conductive, thereby shunting the impedance matching resistor 226. Graphs C, D and E illustrate the operation of transistors 220, 234 and 244 as described above.

Figure 6:
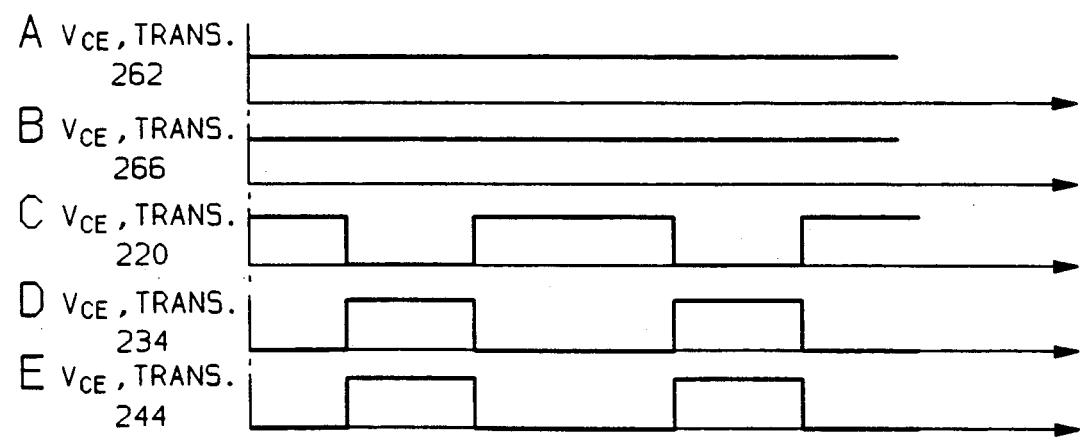

FIG. 6 shows waveforms for the condition where bridge transistor PHA(U) is reverse biased due to the lagging power factor of motor 10. Here, Graphs A and B indicate that transistors 262 and 266 remain nonconductive in this condition.

In the above-described manner, the impedance matching network of this invention dynamically maintains a substantially constant impedance on the secondary windings of the bridge driver transformers. This, along with the complementary gating of the upper and lower bridge transistor pairs, ensures that the primary winding impedances are also substantially equal and constant. With equal and constant primary winding impedances, the current regulator of FIG. 3 can deliver substantially equal regulated currents to each of the six bridge transistors at a substantially equal voltage, thereby enabling the base drive current to be controlled with a single common regulator.

While this invention has been described in reference to the illustrated embodiment, it is expected that various modifications will occur to those skilled in the art, and it should be understood that drive systems incorporating such modifications may fall within the scope of this invention, which is defined by the appended claims.

The embodiments of the invention in which an exclusive property or privilege is claimed are defined as follows:

1. Drive apparatus for a multi-phase AC motor comprising in combination:
   bridge inverter means including pairs of bridge transistors linking each motor phase to positive and negative DC supply voltages, each bridge transistor being effective when supplied with bias current for electrically connecting such motor phase to the respective supply voltage;
   a source of regulated alternating current;

transformer means including a transformer for each motor phase, each such transformer having a primary winding energized by said source of regulated alternating current and a pair of secondary circuits connected to supply bias current to the pair of bridge transistors for the same motor phase, the primary windings being serially connected to form a load for said source of regulated alternating current so that the bias current supplied to all of said bridge transistors by said secondary circuits is controlled by said source of regulated alternating current; and logic means for biasing the bridge transistors for each motor phase conductive and non conductive in substantial complementary fashion, thereby to substantially equalize the loading of each respective transformer.

* * * * *